United States Patent
Tsujishita et al.

(10) Patent No.: US 6,788,923 B2
(45) Date of Patent: Sep. 7, 2004

(54) RECEIVER NOISE REDUCTION WITH EXPANDING GATED PULSES

(75) Inventors: Masahiro Tsujishita, Tokyo (JP); Kenichi Taura, Tokyo (JP); Masayuki Tsuji, Tokyo (JP); Masayuki Ishida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 449 days.

(21) Appl. No.: 09/783,098

(22) Filed: Feb. 15, 2001

(65) Prior Publication Data

US 2001/0016475 A1 Aug. 23, 2001

(30) Foreign Application Priority Data

Feb. 23, 2000 (JP) ........................................ 2000-046522

(51) Int. Cl.[7] ................................................. H04B 1/10
(52) U.S. Cl. .................... 455/223; 455/296; 375/351
(58) Field of Search ................................. 455/222, 296, 455/223, 205, 226.2, 226.1, 226.4; 375/351

(56) References Cited

U.S. PATENT DOCUMENTS

| | | | | |
|---|---|---|---|---|
| 4,856,084 A | * | 8/1989 | Richards, Jr. ............... | 455/223 |
| 5,140,704 A | * | 8/1992 | Ueno .......................... | 455/296 |
| 6,347,146 B1 | * | 2/2002 | Short et al. .................. | 381/15 |
| 6,424,825 B1 | * | 7/2002 | Ecklund et al. .............. | 455/205 |
| 6,473,605 B1 | * | 10/2002 | Ecklund et al. .............. | 455/296 |
| 6,577,851 B1 | * | 6/2003 | Ecklund et al. .............. | 455/223 |

FOREIGN PATENT DOCUMENTS

| | | | |
|---|---|---|---|
| EP | 0 696 852 A2 | 2/1996 | |
| EP | 1 120 919 A2 | 8/2001 | |
| JP | 6387026 | 4/1988 | |
| JP | 04-365229 | * 12/1992 | ............ H04B/1/10 |

* cited by examiner

Primary Examiner—Edward F. Urban
Assistant Examiner—Blane J. Jackson
(74) Attorney, Agent, or Firm—Birch, Stewart, Kolasch & Birch, LLP

(57) ABSTRACT

A noise reducer generates a gate signal by detecting noise in a demodulated signal, and changes the lengths the gate pulses indicating the presence of noise according to the electric-field strength of a radio signal from which the demodulated signal has been obtained. The demodulated signal is modified during intervals indicated by the gate pulses, to reduce the noise. The amount of change of the gate-pulse lengths is preferably increased as the electric-field strength decreases. Noise can then be removed satisfactorily under even weak electric-field conditions.

12 Claims, 14 Drawing Sheets

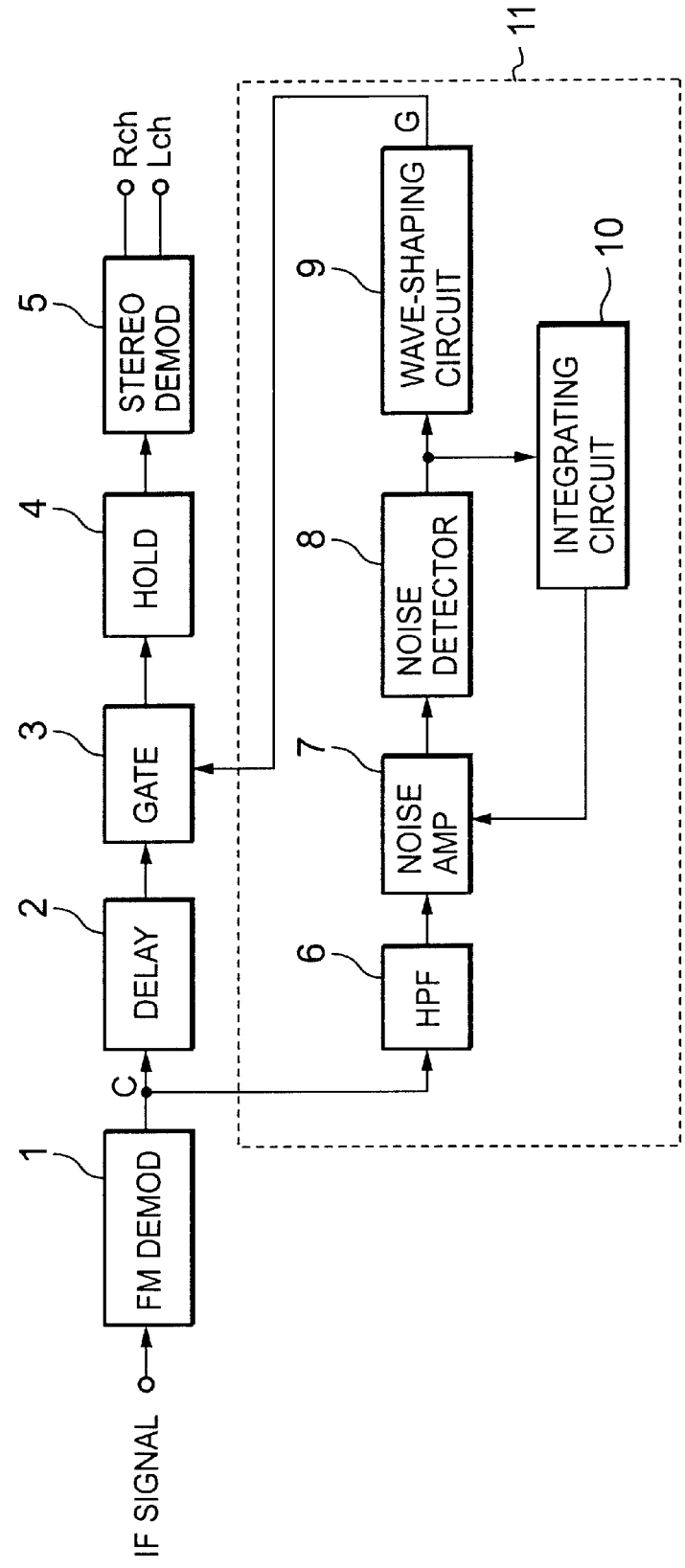

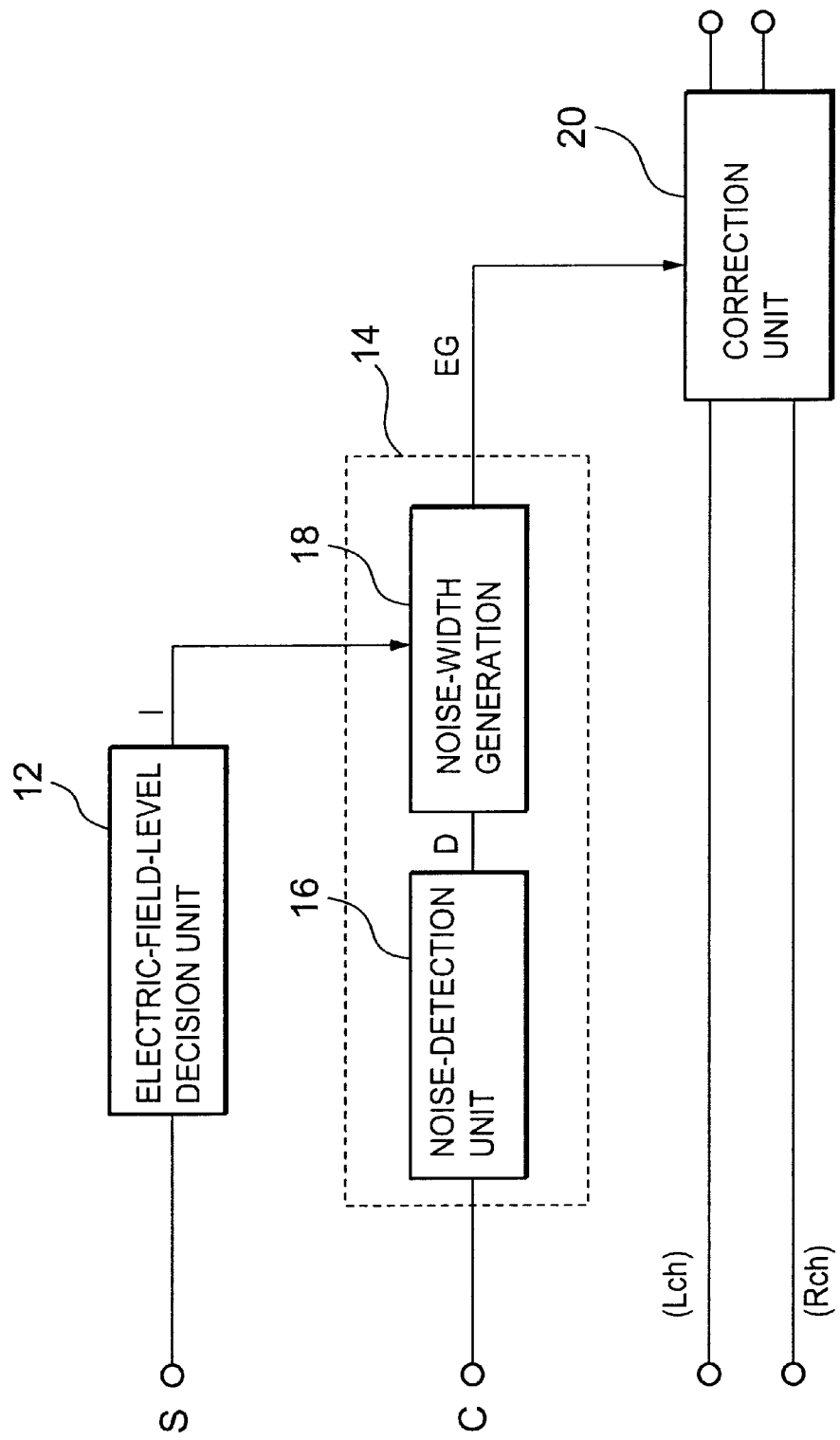

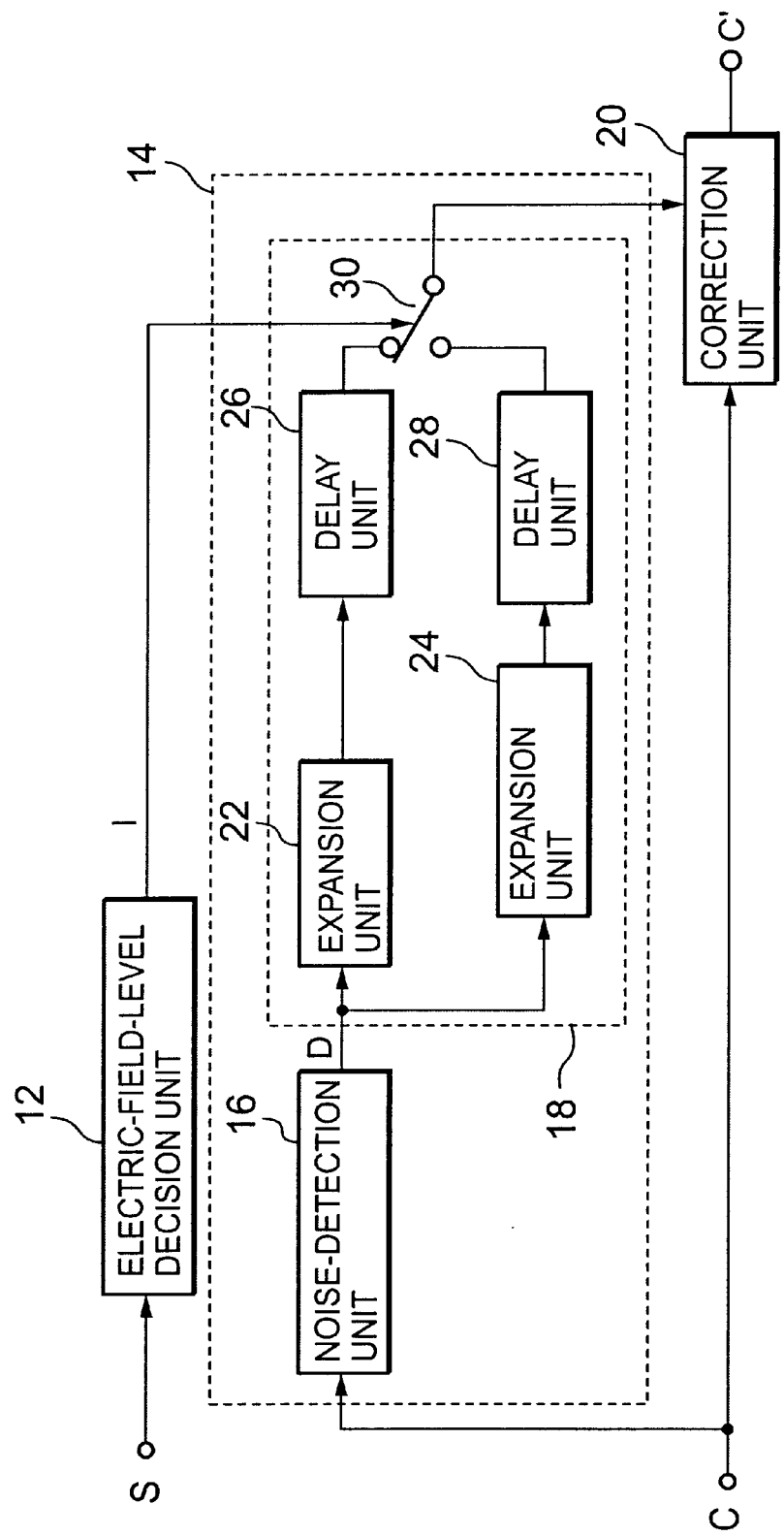

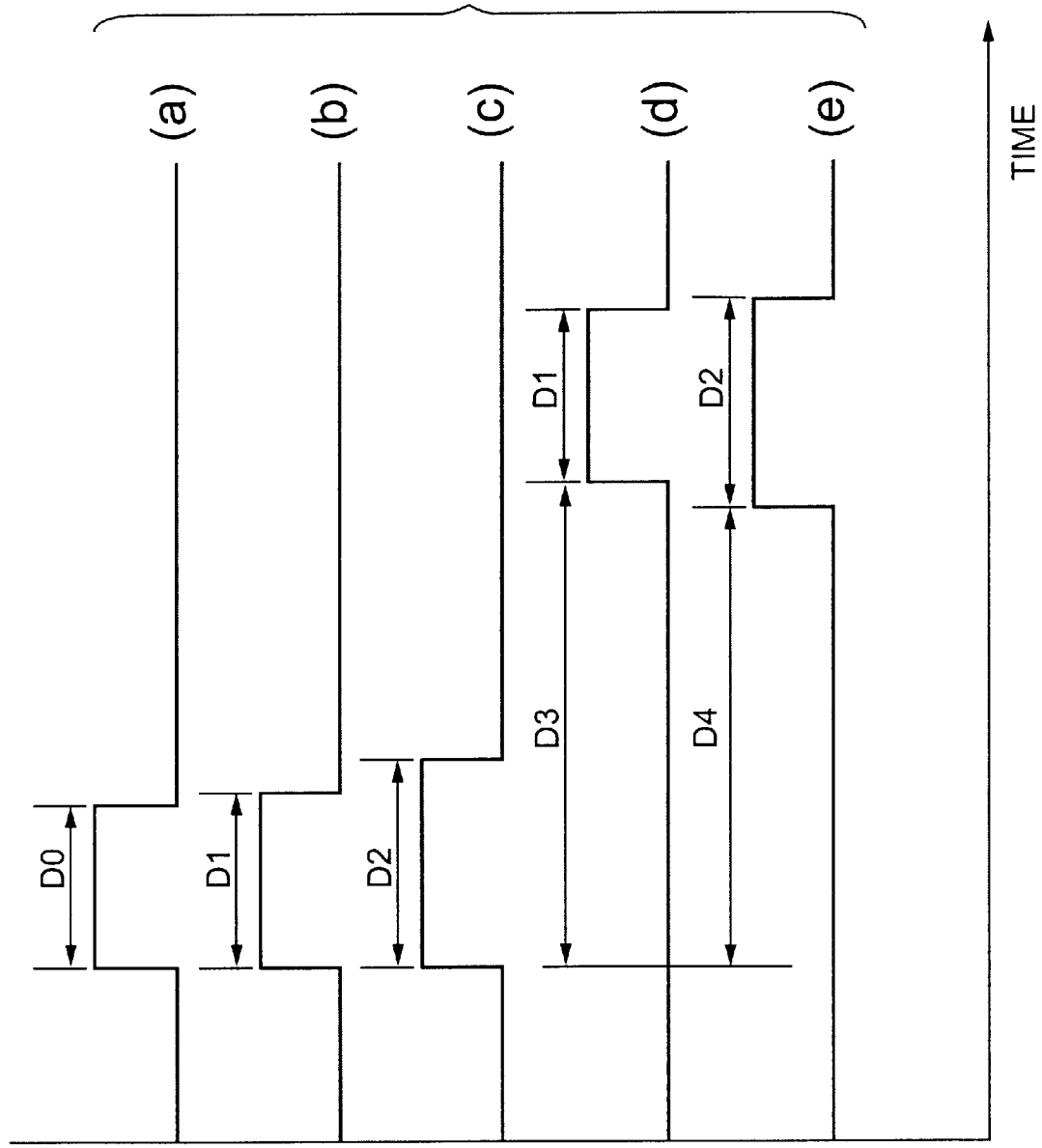

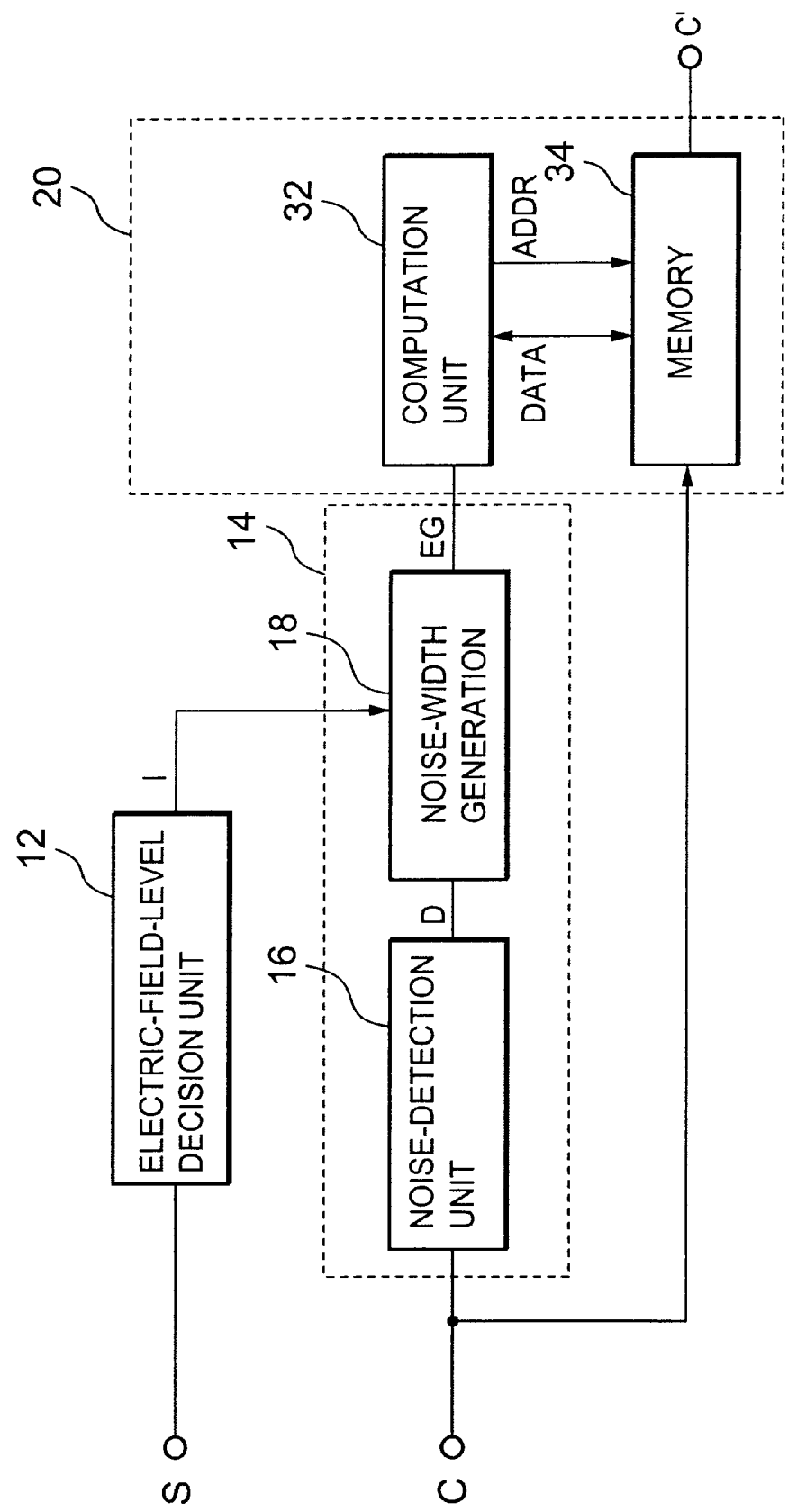

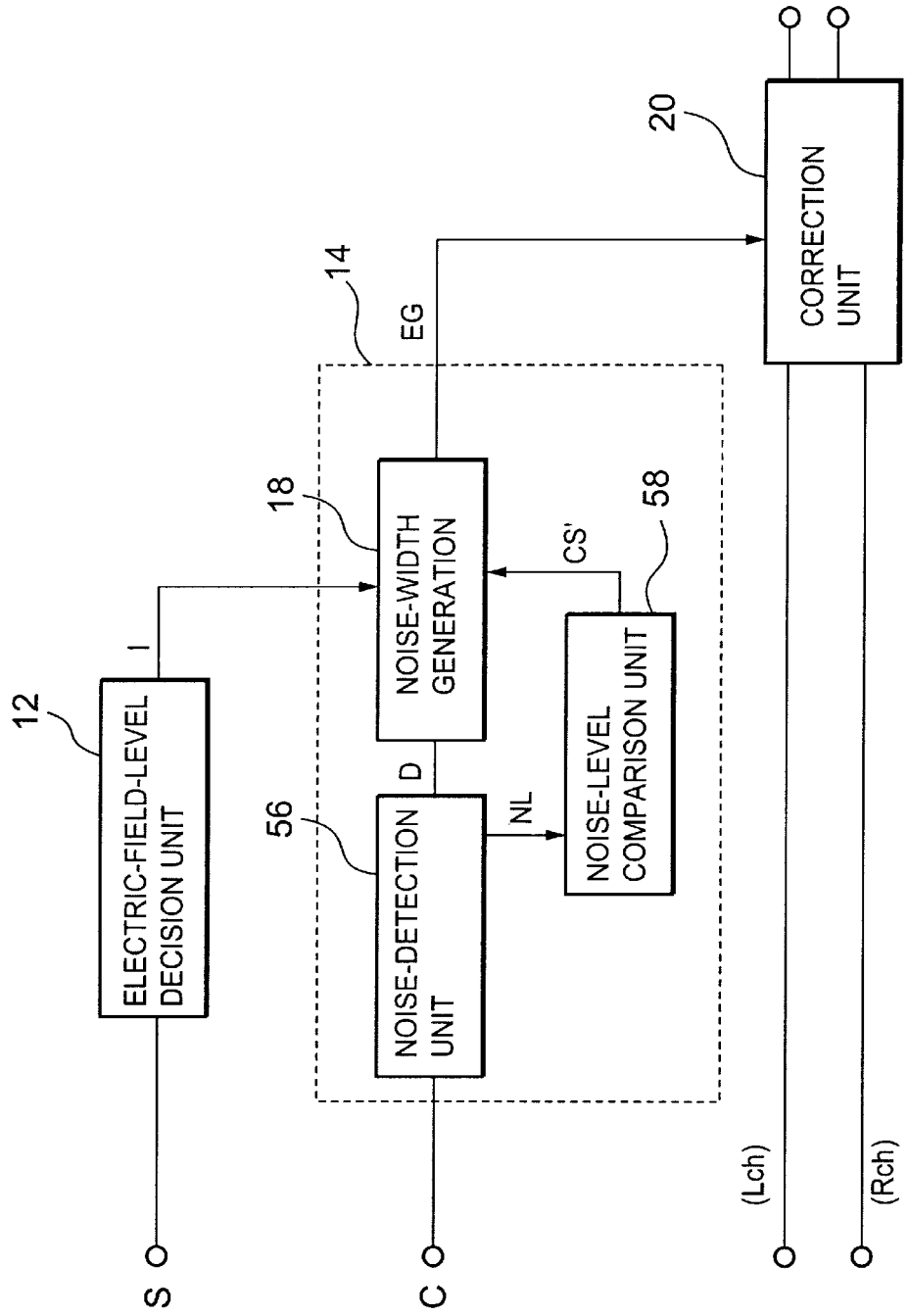

RECEIVER NOISE REDUCTION WITH EXPANDING GATED PULSES

BACKGROUND OF THE INVENTION

The present invention relates to a noise reducer and noise reduction method useful for reducing impulse noise and other noise in, for example, a car radio.

Impulse noise such as ignition noise and electric-mirror noise occurs frequently in the car environment, and is readily picked up by the antenna of a car radio. (Electric-mirror noise occurs when an electrically driven mirror is raised or lowered.) The audible effects of such noise in the audio output of a car radio are a familiar experience to automobile riders. To prevent impulse noise from becoming audible, a car radio requires an impulse noise reducer.

A conventional impulse noise reducer operates by detecting each noise impulse, and blanking out the noise by holding the output audio signal constant, or performing some type of interpolation. Further details of the conventional noise-reduction process will be given later.

A problem is that impulse noise is detected in relation to the general noise floor. When a strong broadcast signal is received, the noise floor is low, and substantially all of each noise impulse can be detected. When a weak broadcast signal is received, however, the noise floor rises, and a considerable portion of each noise impulse may fail to be detected. The undetected parts are not blanked out, so the impulse noise, although reduced, remains audible in the output signal.

This problem is not limited to impulse noise, but occurs when any type of noise is blanked out by the method described above.

SUMMARY OF THE INVENTION

An object of the invention is to provide improved noise reduction in a demodulated signal, under both weak and strong received electric-field conditions.

A further object is to avoid unnecessary distortion of the demodulated signal.

The invented noise reduction method removes noise from a demodulated signal by the following steps:

(a) determining the electric-field strength of a radio signal from which the demodulated signal has been obtained;

(b) comparing the electric-field strength with at least one predetermined reference value, thereby generating an indicator signal indicating the electric-field strength;

(c) detecting noise in the demodulated signal;

(d) generating gate pulses responsive to the indicator signal and to detection of the noise; and (e) modifying the demodulated signal during intervals indicated by the gate pulses, thereby reducing the noise.

Step (c) preferably includes the output of pulses indicating noise detection. Step (d) then includes changing lengths of these noise-detection pulses by different amounts according to the indicator signal, preferably changing the lengths by increasing amounts as the electric-field strength decreases.

Changing the pulse lengths in this way can improve noise reduction performance by removing more of the noise, especially when the received electric field is weak.

Step (d) may be carried out by expanding the noise-detection pulses by different amounts to generate a plurality of expanded signals, delaying the expanded signals by different amounts, and selecting one of the delayed expanded signals as a gate signal. The delays enable the gate pulses to be correctly aligned with the impulse noise.

Step (e) may be carried out by storing a certain number of samples of the demodulated signal in a memory, and altering the stored sample values. A variety of alterations can then be carried out in a simple way.

The invented method may also include steps of detecting the overall amplitude level and the high-frequency amplitude level of the modified demodulated signal, and comparing these two amplitude levels. When the high-frequency amplitude level exceeds the overall amplitude level, step (d) is omitted; the demodulated signal is modified during the intervals indicated by the noise-detection pulses. Distortion of high-frequency components of the demodulated signal is thereby avoided.

The invented method may also include steps of detecting the noise level in the demodulated signal, and comparing the noise level with a lower limit. When the noise level is less than the lower limit, step (d) is omitted; the demodulated signal is modified during the intervals indicated by the noise-detection pulses. Unnecessary distortion of the demodulated signal due to over-correction is thereby avoided.

The invented method may also increase the amounts by which the pulse lengths are changed in step (d) when the noise level exceeds a predetermined value, thereby compensating for the spreading of strong impulse noise due to other processing of the demodulated signal.

The invention also provides impulse noise reducers employing the methods described above.

BRIEF DESCRIPTION OF THE DRAWINGS

In the attached drawings:

FIG. 1 is a block diagram showing the structure of a conventional impulse noise reducer;

FIG. 5 is a block diagram of an impulse noise reducer illustrating a first embodiment of the invention;

FIG. 7 is a block diagram of an impulse noise reducer illustrating a second embodiment of the invention;

FIG. 8 is a waveform diagram illustrating the operation of the second embodiment;

FIG. 9 is a block diagram of an impulse noise reducer illustrating a third embodiment of the invention;

FIG. 15 is a block diagram of an impulse noise reducer illustrating a sixth embodiment of the invention.

DETAILED DESCRIPTION OF THE INVENTION

Figure 2A:
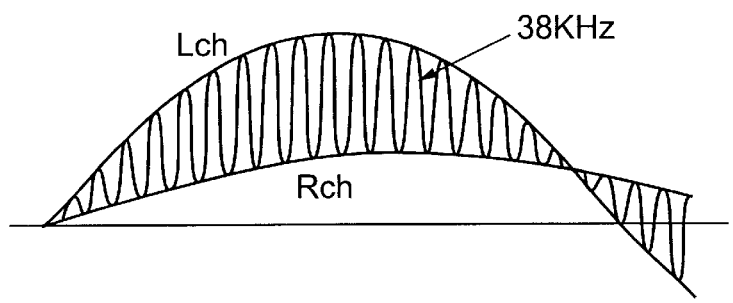
FIGS. 2A, 2B, and 2C are waveform diagrams illustrating stereo demodulation.

Embodiments of the invention will be described below with reference to the drawings. A conventional impulse noise reducer, part of which may be used in the present invention, will also be described. Similar reference characters will be used for similar elements in the drawings, and repeated descriptions of similar elements will be omitted. All of the impulse noise reducers described below operate in frequency-modulation (FM) stereo radio receivers.

FIG. 1 is a block diagram showing the relevant parts of an FM stereo car radio with a conventional impulse noise reducer. The front-end circuits that convert the received FM broadcast signal to an intermediate-frequency (IF) signal have been omitted. The IF signal is supplied to an FM demodulator (DEMOD) 1, which demodulates the IF signal and outputs a stereo composite signal C, referred to below simply as a composite signal. The composite signal includes a left-right sum component, which can be used as a monaural audio signal, and a left-right difference component, which is amplitude-modulated by balanced modulation around a subcarrier frequency of thirty-eight kilohertz (38 kHz). The composite signal is supplied through a delay circuit 2, a gate circuit 3, and a holding circuit 4 to a stereo demodulator 5, which combines the sum and difference components to obtain right-channel (Rch) and left-channel (Lch) stereo audio signals. These audio signals are amplified and reproduced through respective loudspeakers (not visible).

Figure 2B:
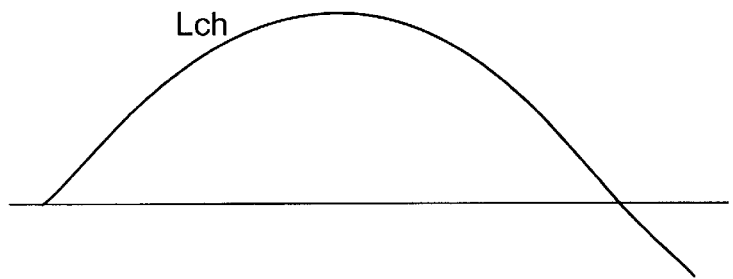
Figure 2C:
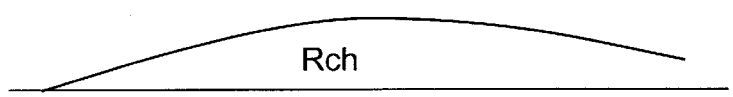

FIG. 2A illustrates the composite signal, showing the 38-kHz subcarrier. The left-channel and right-channel signals can be obtained from the envelope of the composite signal, by sampling the signal in synchronization with the subcarrier, for example. FIG. 2B shows the left-channel signal output from the stereo demodulator 5. FIG. 2C shows the right-channel signal.

Referring again to FIG. 1, the composite signal is also supplied to a high-pass filter (HPF) 6, which rejects the left-right sum and difference frequencies that are intentionally present in the composite signal, leaving only high-frequency noise components. These noise components are amplified by a variable-gain noise amplifier (AMP) 7, then rectified by a noise detector 8. The rectified noise signal is supplied to a wave-shaping circuit 9 and an integrating circuit 10. The integrating circuit 10 smoothes the rectified noise signal, obtaining a direct-current (dc) signal responsive to the noise level. This dc signal is fed back to the noise amplifier 7 and controls the gain thereof, forming an automatic-gain-control (AGC) loop. The wave-shaping circuit 9 converts the rectified noise signal to a noise-detection signal that takes on two logic levels, referred to as high and low. The noise-detection signal goes high when the rectified noise signal exceeds a predetermined threshold level. In the prior art, the noise-detection signal is used as a gate signal G, and an interval during which the gate signal is high is referred to as a gate pulse.

The high-pass filter 6, noise amplifier 7, noise detector 8, wave-shaping circuit 9, and integrating circuit 10 constitute a noise detection circuit 11.

During each gate pulse, the gate circuit 3 opens, blocking the delayed composite signal, and the holding circuit 4 continues to output the last received value of the composite signal. When the gate signal is low, the composite signal passes unimpeded through the gate circuit 3 and holding circuit 4 to the stereo-demodulation circuit 5.

Figure 3A:
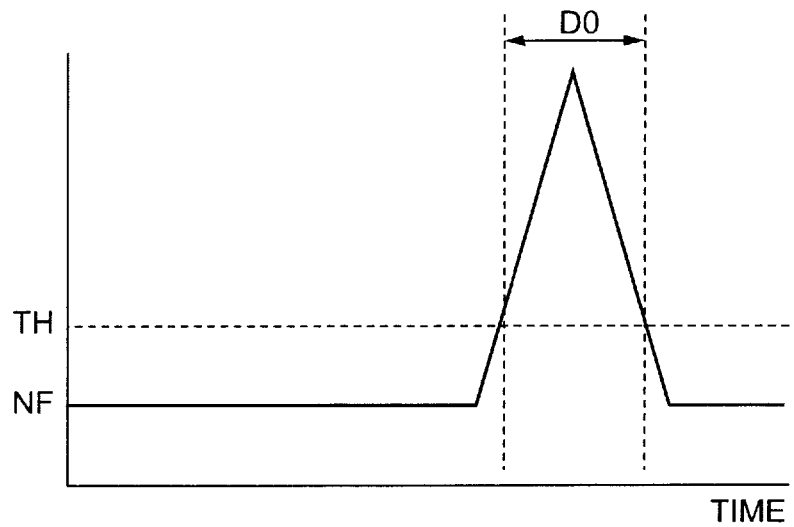
FIGS. 3A and 3B are waveform diagrams schematically illustrating impulse noise detection with strong and weak received electric fields.
Figure 3B:
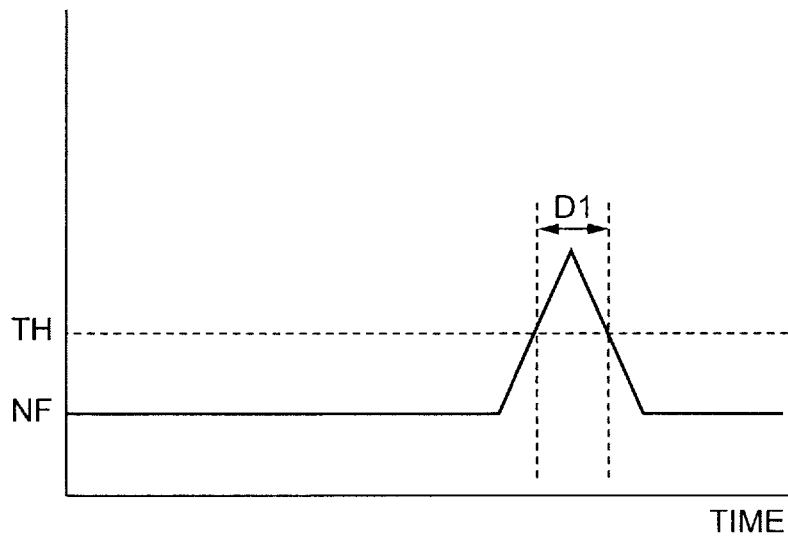

FIGS. 3A and 3B illustrate the output of the noise detector 8, showing time on the horizontal axis and signal level on the vertical axis. Automatic gain control operates to hold the noise floor at a fixed level NF well below the predetermined threshold level TH that triggers output of a gate pulse from the wave-shaping circuit 9.

FIG. 3A illustrates the occurrence of a noise impulse when the FM broadcast signal is received with a strong electric field at the receiving antenna. Under these conditions, there is relatively little background noise, so considerable amplification is required to bring the noise floor up to the fixed level NF. The noise impulse is also amplified, and exceeds the threshold level TH for an interval D0 long enough for substantially all of the noise impulse to be detected.

FIG. 3B illustrates the occurrence of a similar noise impulse when the received electric field of the FM broadcast signal is weak. Under these conditions, there is more background noise, so less amplification is required to bring the noise floor up to the NF level. The noise impulse is also less amplified, and exceeds the threshold level TH for an interval D1 that is much shorter than the actual duration of the noise impulse.

Figure 4A:
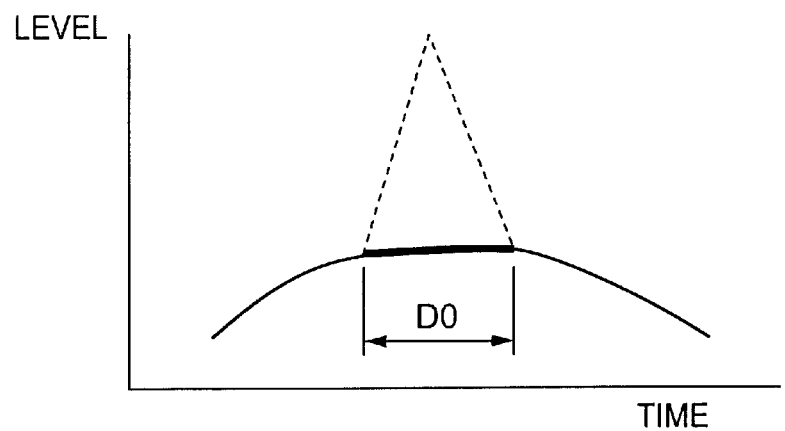
FIGS. 4A and 4B are waveform diagrams schematically illustrating impulse noise correction.
Figure 4B:
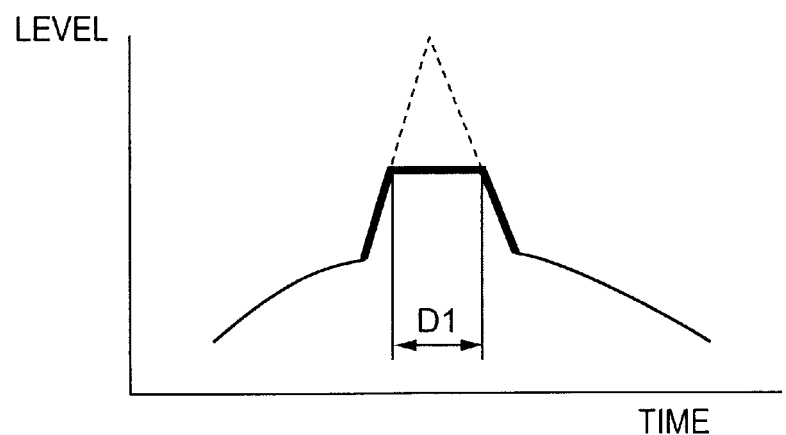

The gate pulses output by the noise detection circuit 11 ideally match the durations of the noise impulses, but from FIGS. 3A and 3B it can be seen that a weak received electric field may lead to gate pulses that are far too short. FIGS. 4A and 4B illustrate impulse noise reduction for two cases, showing time on the horizontal axis and the audio signal level output by the stereo demodulator 5 on the vertical axis. Similar noise impulses occur in both drawings. Dashed lines indicate the parts of the noise that are blanked out. The thickened solid lines indicate the audio signal waveform during the duration of the impulse noise. In FIG. 4A, the noise detection circuit 11 generates a gate pulse that covers the entire noise interval, and the output audio signal is substantially free of distortion. In FIG. 4B, the gate pulse is too short, and substantial distortion remains.

First Embodiment

Referring now to FIG. 5, in a first embodiment of the invention, a signal S indicating the received electric-field strength of an FM broadcast signal is supplied to an electric-field-level decision unit 12. This signal S, sometimes referred to as an S-meter signal, is commonly generated in the intermediate-frequency signal-processing circuits (not visible) of an FM receiver. The electric-field-level decision unit 12 compares this signal S with a predetermined reference level, and generates an indicator signal I with high and low logic levels. The indicator signal I goes high, for example, when the received electric-field strength indicated by the signal S exceeds the reference level, and goes low when the received electric-field strength is lower than the reference level.

The stereo composite signal C is supplied to a noise-gate generator 14 comprising a noise-detection unit 16 and a noise-width generation unit 18. The noise-detection unit 16 is similar to the conventional noise detection circuit 11 described above, generating a noise-detection signal D with one high pulse per detected noise impulse. The noise-width generation unit 18 expands these pulses responsive to the indicator signal I output by the electric-field-level decision unit 12, generating an expanded gate signal EG.

The expanded gate signal EG output from the noise-width generation unit 18 is supplied to a correction unit 20, which also receives the left-channel (Lch) and right-channel (Rch) audio signals. While the expanded gate signal EG is low, the correction unit 20 passes these audio signals Lch, Rch through with no modification other than a predetermined delay. While the expanded gate signal EG is high, the correction unit 20 holds the audio signals constant.

The audio signals may be either analog or digital signals. The electric-field-level decision unit 12, noise-gate generator 14, and correction unit 20 may be either analog or digital circuits. If digital, they may be implemented by software running on, for example, a digital signal processor (DSP).

Next, the operation of the first embodiment under strong and weak electric-field conditions will be described When the indicator signal I is high, indicating a strong received electric field, the noise-width generation unit 18 lengthens each high pulse received from the noise-detection unit 16 by a first predetermined amount, and outputs the resulting gate pulses with a first predetermined delay.

When the indicator signal I is low, indicating a weak received electric field, the noise-width generation unit 18 lengthens each high pulse received from the noise-detection unit 16 by a second predetermined amount, greater than the first predetermined amount, and outputs the resulting gate pulses with a second predetermined delay.

The first and second predetermined amounts produce expanded gate pulses wide enough to cover substantially all of each noise impulse. From FIGS. 3A and 3B it can be seen that the first predetermined amount need not be as large as the second predetermined amount. The first and second predetermined delays are arranged to center the expanded gate pulses on the noise impulses as delayed in the correction unit 20.

By holding the audio signals Lch, Rch constant during the expanded gate pulses, the correction unit 20 replaces each audio signal Lch, Rch during each impulse-noise interval with the value of the same audio signal just before the impulse-noise interval began. Substantially all impulse noise is thereby removed from the output audio signals.

Figure 6A:
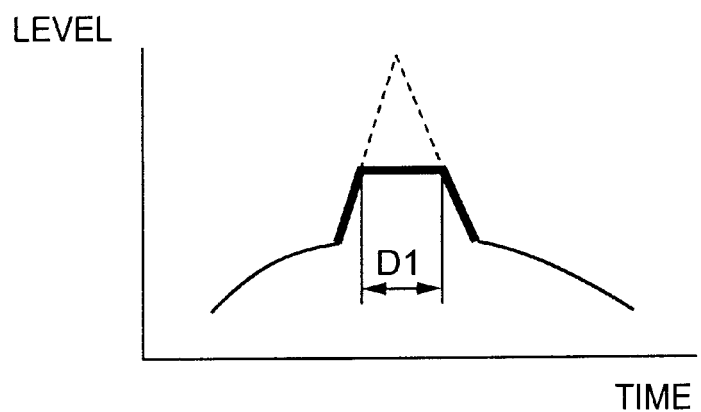
FIGS. 6A and 6B are waveform diagrams illustrating impulse noise correction with and without gate-pulse expansion.

FIG. 6A shows the audio output signal (either Lch or Rch) that would be obtained if impulse noise occurred while the received electric field was weak and the gate pulses were not expanded. The non-expanded pulse output by the noise-detection unit 16 has a duration D1. If the audio signal were to be held constant only for this interval D1, considerable distortion would remain in the modified audio waveform.

Figure 6B:
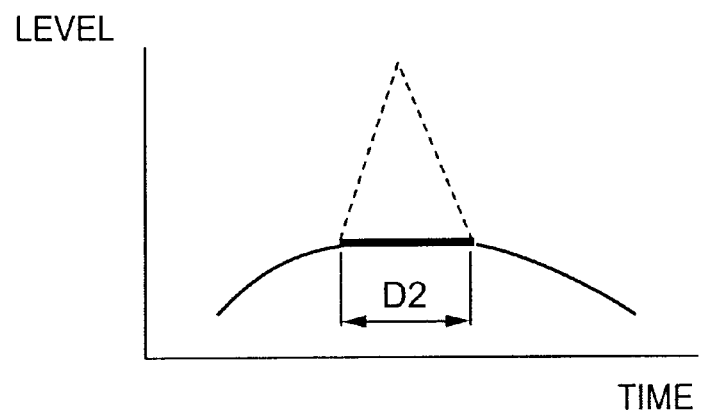

FIG. 6B shows the audio signal obtained from the correction unit 20 after the noise-width generation unit 18 increases the pulse length. The resulting expanded gate pulse has a duration D2 covering the entire noise impulse. The modified audio signal remains constant for this duration, and is substantially free of distortion.

As shown by FIGS. 6A and 6B, expanding the gate pulses can greatly improve the noise reduction performance of the impulse noise reducer.

In a variation of the first embodiment, the electric-field-level decision unit 12 compares the electric-field strength indicated by the signal S with a plurality of thresholds and generates a multi-valued indicator signal. The noise-width generation unit 18 expands the gate pulses by different amounts according the multi-valued indicator signal, the expansion increasing in a stepwise manner as the received electric-field strength decreases. The pulse width of the expanded gate pulses is thereby matched more closely to the actual impulse-noise durations.

In another variation, the electric-field-level decision unit 12 outputs an analog signal, and the correction unit 20 varies the amount of expansion in a continuous manner, the expansion again increasing as the received electric-field strength decreases.

Second Embodiment

Referring to FIG. 7, in the second embodiment, the electric-field-level decision unit 12, noise-detection unit 16, and correction unit 20 are as described in the first embodiment, except that the correction unit 20 receives and modifies the stereo composite signal C instead of the left-channel and right-channel audio signals. The modified composite signal, denoted C', is supplied to a stereo demodulator (not visible). The noise-width generation unit 18 comprises a pair of expansion units 22, 24, a pair of delay units 26, 28, and a switch 30.

The noise-detection signal D output from the noise-detection unit 16 is supplied to both expansion units 22, 24. Expansion unit 22 expands each high pulse by the first predetermined amount mentioned in the first embodiment, by delaying the fall of signal D. Expansion unit 24 expands each high pulse by the second predetermined amount mentioned in the first embodiment, by delaying the fall of the signal D by a greater amount than in expansion unit 22. Delay unit 26 passes the expanded pulse signal output by expansion unit 22 to the switch 30 with a predetermined delay. Delay unit 28 passes the expanded pulse signal output by expansion unit 24 to the switch 30 with another, shorter, predetermined delay.

The switch 30 also receives the indicator signal I output by the electric-field-level decision unit 12. The switch 30 selects the output of delay unit 26 when the indicator signal I is high, indicating a strong electric field, and selects the output of delay unit 28 when the indicator signal I is low, indicating a weak electric field. The selected signal is supplied to the correction unit 20 as the expanded gate signal EG. The correction unit 20 corrects the composite signal C for the durations of the selected expanded gate pulses, by holding the value just before each expanded gate pulse.

The operation of the noise-width generation unit 18 in the second embodiment is illustrated in FIG. 8. The first waveform (a) is the noise-detection signal D received from the noise-detection unit 16, showing one pulse of duration D0. The next waveform (b) is the signal output by expansion unit 22, in which the pulse is expanded to a longer duration D1. The next waveform (c) is the signal output by expansion unit 24, in which the pulse is expanded to a still longer duration D2. Both expanded pulses go high at the same time as the pulse output by the noise-detection unit 16, but their high-to-low transitions are delayed.

The next waveform (d) is the delayed signal output by delay unit 26, in which the output of expansion unit 22 is delayed by an amount D3. This waveform is selected by the switch 30 when the received electric field is relatively strong. The last waveform (e) is the delayed signal output by delay unit 26, in which the output of expansion unit 22 is delayed by a lesser amount D4. This waveform is selected by the switch 30 when the received electric field is relatively weak. Delays D3 and D4 are predetermined in relation to the expansions so that both delayed expanded gate pulses are centered at substantially the same point on the time axis, coinciding with the center of the noise impulse as delayed in the correction unit 20.

The optimum delays D3, D4 can be determined by supplying a sine-wave signal with intentionally added impulse noise as the composite signal C, and selecting the delays that minimize the distortion ratio of the modified signal C' output by the correction unit 20.

The second embodiment provides the same effects for the stereo composite signal C as the first embodiment provided for the left-channel and right-channel audio signals.

In a variation of the second embodiment, the electric-field-level decision unit 12 uses multiple threshold values and generates a multi-valued indicator signal. The noise-width generation unit 18 includes additional expansion units and delay circuits with different expansion and delay amounts, which are selected on the basis of the multi-valued indicator signal so that the expansion increases as the electric-field strength decreases.

Third Embodiment

In the third embodiment, the electric-field-level decision unit 12 and noise-gate generator 14 are as described in the first embodiment. The correction unit 20 has the structure shown in FIG. 9, comprising a computation unit 32 and a memory 34. The memory 34 receives and temporarily stores the stereo composite signal C, which is a digital signal. The memory 34 stores a predetermined number of most recent samples of the composite signal C. The oldest stored sample is read out as the modified composite signal C'. The computation unit 32 receives the gate signal output by the noise-width generation unit 18, and alters the contents of the memory 34 when a gate pulse occurs, by sending addresses (ADDR) to the memory 34, and reading and writing data at these addresses.

Next, the operation of the correction unit 20 in the third embodiment will be described.

Figure 10:
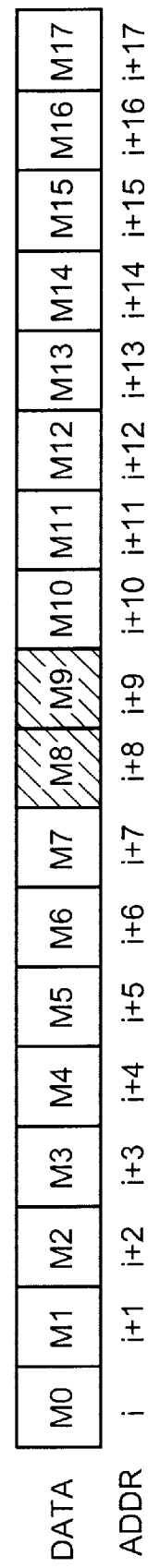
FIG. 10 illustrates the structure of the memory in the third embodiment.

FIG. 10 shows the internal structure of the memory 37, illustrating the case in which the eighteen most recent samples (M0 to M17) of the composite signal are stored. The most recent sample (M0) is stored at an address i; the oldest sample (M17) is stored at address i+17.

When a new sample value is received, the oldest stored sample (M17) is output from address i+17 as the modified composite signal C', and the other stored samples are shifted one address backward. That is, sample M16 is moved to address i+17, sample M15 to address i+16, and so on, sample M0 moving into address i+1. The new sample is then stored at address i.

The number of samples stored in the memory 34 is of course not limited to eighteen. The appropriate number of samples depends on the type of impulse noise to be corrected. About twenty samples is appropriate for reducing ignition noise when the sampling frequency of each audio signal is equal to the subcarrier frequency (38 kHz). For reducing electric-mirror noise, a smaller number of samples may be adequate, such as ten samples. To reduce several types of impulse noise, caused by several different motors, for example, more samples may be necessary, e.g., forty samples.

When the noise-gate generator 14 outputs an expanded gate pulse, the duration of the expanded gate pulse corresponds to a certain number of samples. For the sake of illustration, it will be assumed below that an expanded gate pulses with a duration corresponding to two samples, specifically to M8 and M9, is received.

To hold the composite signal constant at the value preceding the noise interval, the computation unit 32 reads sample M10 from address i+10, and writes the M10 value at addresses i+8 and i+9, replacing the samples M8 and M9 corrupted by the noise impulse.

Alternatively, the computation unit 32 may perform mean-value interpolation, by reading the sample values M7 and M10 at both ends of the noise interval, calculating their mean value (M10+M7)/2, and writing this mean value at addresses i+8 and i+9.

The computation unit 32 may also carry out linear interpolation or polynomial interpolation, detailed descriptions of which will be omitted.

The third embodiment provides effects similar to those of the first and second embodiments. As a further effect, the structure of the correction unit 20 enables various types of corrections to be performed easily.

Fourth Embodiment

Figure 11:
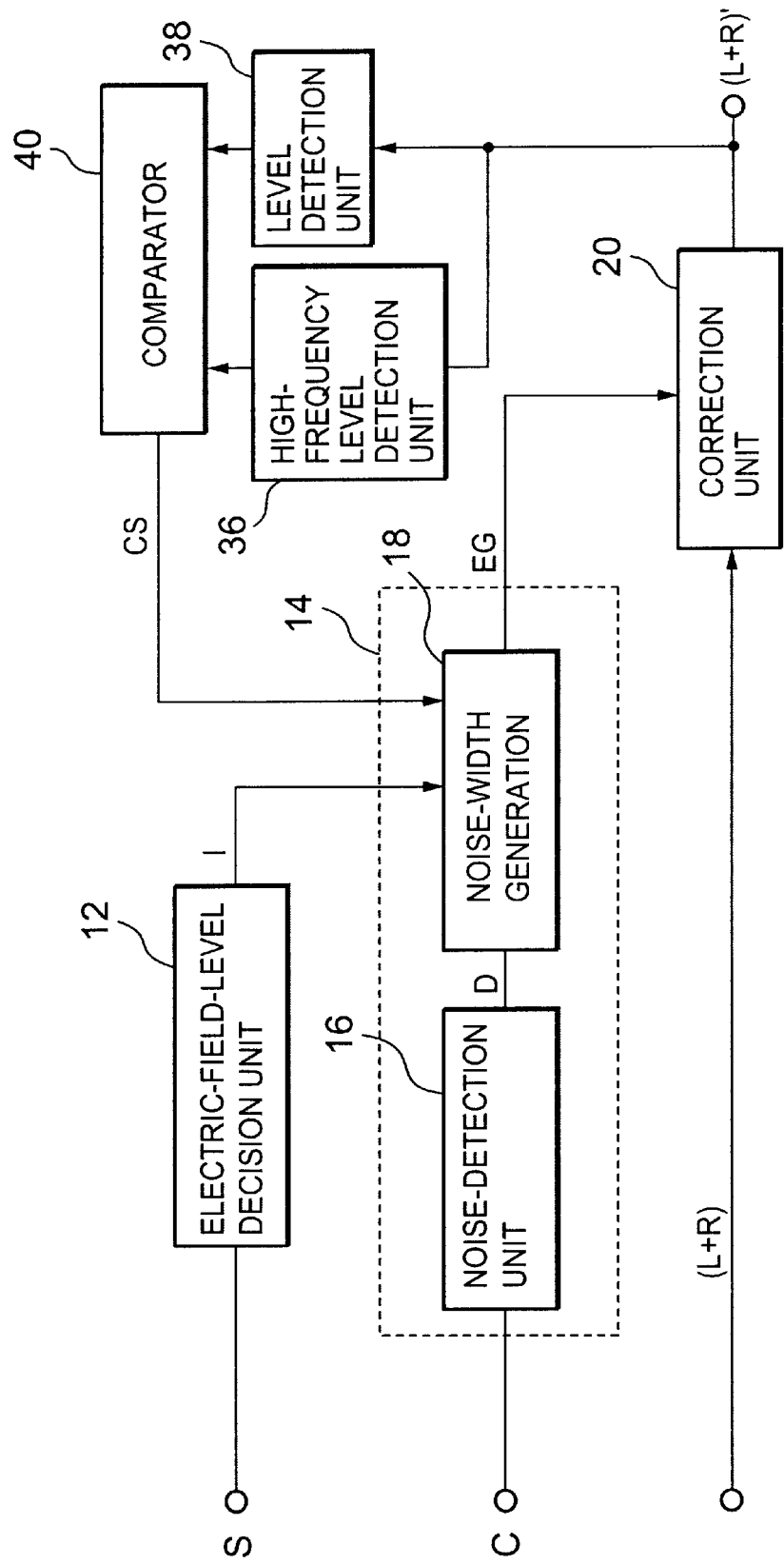
FIG. 11 is a block diagram of an impulse noise reducer illustrating a fourth embodiment of the invention.

Referring to FIG. 11, the fourth embodiment adds a high-frequency level detection unit 36, a level detection unit 38, and a comparator 40 to the configuration of the first embodiment. Furthermore, the correction unit 20 receives the left-plus-right sum signal (L+R) as a monaural audio signal, and outputs a corrected monaural signal.

The corrected monaural signal (L+R)' is supplied to both the high-frequency level detection unit 36 and level detection unit 38. The high-frequency level detection unit 36 detects the high-frequency amplitude level of the corrected monaural signal. The level detection unit 38 detects the overall amplitude level of the corrected monaural signal. The comparator 40 compares the high-frequency amplitude level with the overall amplitude level, and sends the noise-width generation unit 18 a control signal CS indicating which level is higher. The noise-width generation unit 18 operates as described in the first embodiment, expanding the pulses received from the noise-detection unit 16, when the overall amplitude level is higher, but does not expand the pulses when the high-frequency amplitude level is higher.

Figure 12:
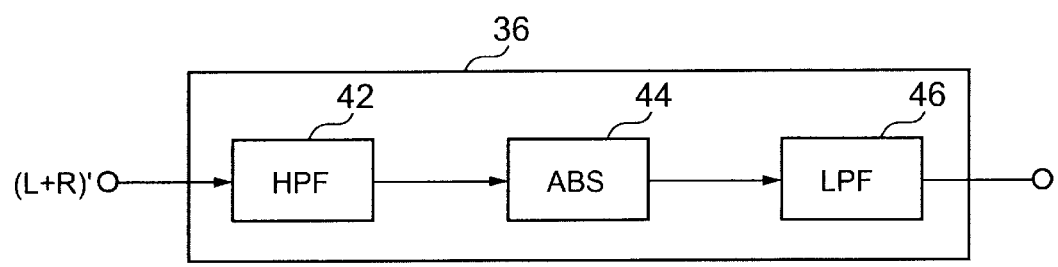
FIG. 12 is a block diagram showing one possible structure of the high-frequency level detection unit in the fourth embodiment.

FIG. 12 shows an example of the internal structure of the high-frequency level detection circuit 36. The corrected monaural signal (L+R)' output from the correction unit 20 is supplied to a high-pass filter (HPF) 42, which extracts high-frequency audio components. The output of the high-pass filter 42 is rectified by an absolute-value calculation unit (ABS) 44. The rectified high-frequency component is then supplied to a low-pass filter (LPF) 50, the output of which indicates the high-frequency audio signal level. The output signal of the low-pass filter 46 is proportional to the envelope of the waveform of the output signal of high-pass filter 42.

Figure 13:
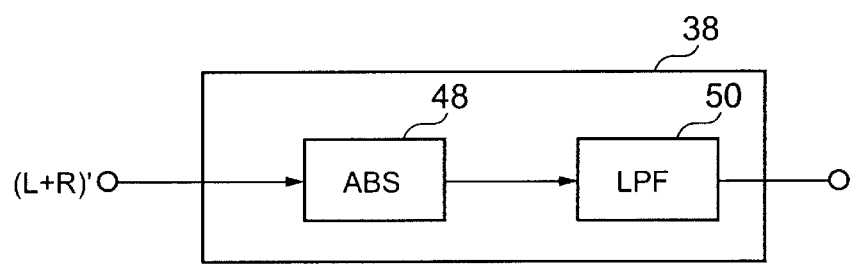
FIG. 13 is a block diagram showing one possible structure of the level detection unit in the fourth embodiment.

Referring to FIG. 13, the level detection unit 38 comprises, for example, an absolute-value calculation unit 48 that rectifies the corrected monaural signal (L+R)', and a low-pass filter 50 that receives the output of the absolute-value circuit 48. The output signal of the low-pass filter 50 is proportional to the envelope of the corrected monaural signal.

The comparator 40 outputs a control signal CS that is high, for example, when the output of the high-frequency level detection unit 36 is greater than the output of the level detection unit 38, and low when the output of the high-frequency level detection unit 36 is equal to or less than the output of the level detection unit 38. In this case, when the control signal CS is at the high level, the noise-width generation unit 18 does not expand the pulses received from the noise-detection unit 16, regardless of the value of the indicator signal I output by the electric-field-level decision unit 12. The noise-detection signal received from the noise-detection unit 16 is supplied to the correction unit 20 with a suitable delay, but with no pulse expansion. When the control signal CS is at the low level, the noise-width generation unit 18 operates as described in the first embodiment, expanding the pulses by different amounts depending on the indicator signal I.

The reason for this is that when the gate pulse width is expanded, the subsequent correction of the audio signal is based on parts of the audio signal waveform comparatively distant from the center of the correction interval. When the audio signal includes strong high-frequency components, these more distant parts of the audio waveform are likely to differ significantly from the parts in the center of the correction interval. Accordingly, more error may be caused by using the more distant audio waveform values than by failing to remove all of the impulse noise. This type of error can produce annoying audible effects, which are avoided by not expanding the gate pulses when strong high-frequency audio components are present.

The gain of the low-pass filter 46 in the high-frequency level detection unit 36 is preferably adjusted in relation to the gain of the low-pass filter in the level detection unit 50 so as to avoid distortion of high-frequency sounds commonly occurring in speech, such as the 's' sound and other sounds with frequencies above 6 kHz.

The fourth embodiment is not restricted to correction of a monaural signal. The correction can be performed on the left-channel and right-channel stereo signals, or on the composite signal, as in the preceding embodiments.

Fifth Embodiment

Figure 14:
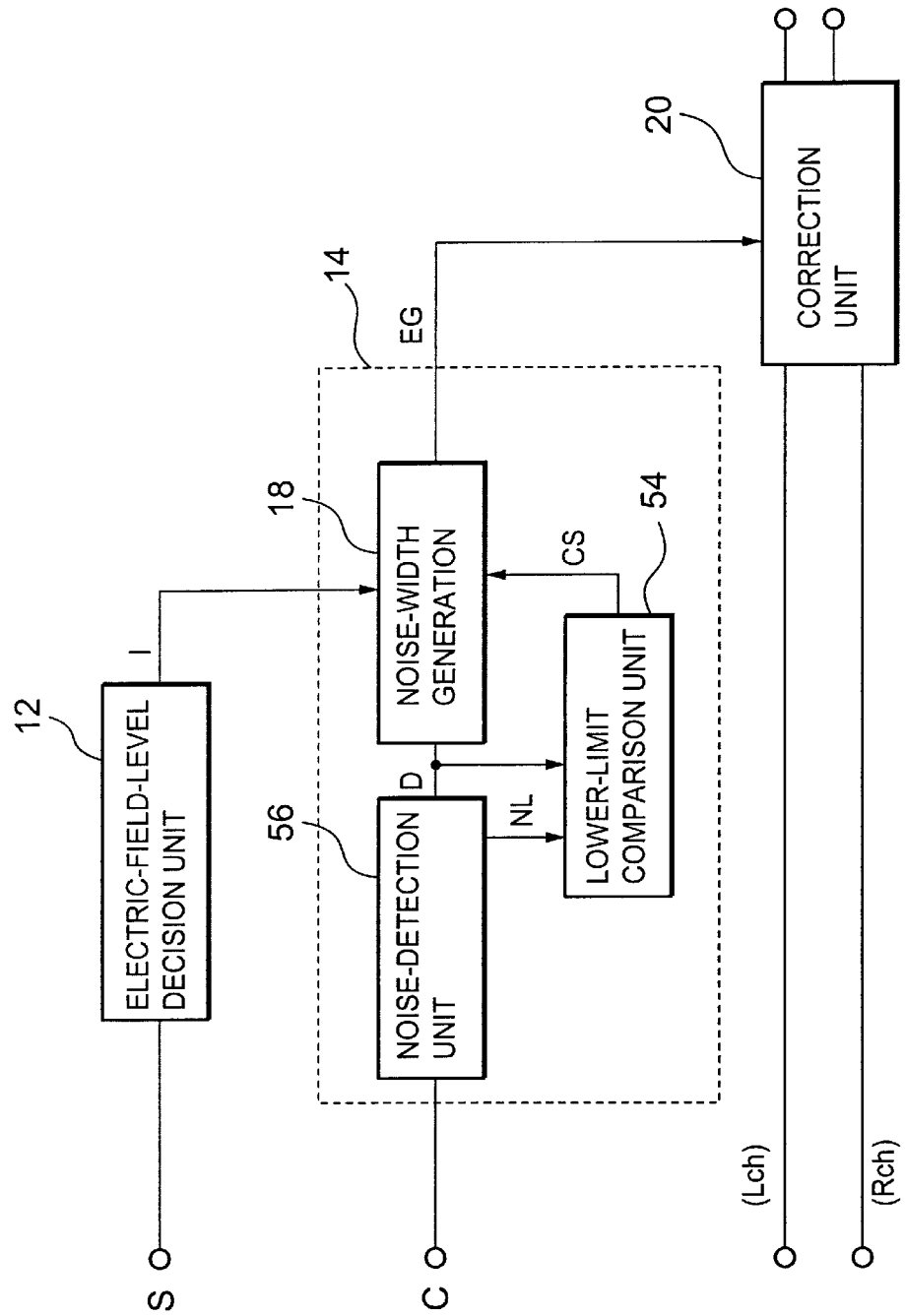
FIG. 14 is a block diagram of an impulse noise reducer illustrating a fifth embodiment of the invention.

Referring to FIG. 14, the fifth embodiment adds a lower-limit comparison unit 54 to the configuration of the first embodiment, and alters the noise-detection unit so as to obtain output of both a noise-detection signal and a signal indicating the level of the detected noise. The noise level signal NL can be obtained as an envelope signal of the output of the high-pass filter 6 in FIG. 1, for example. That is, the output of the high-pass filter 6 can be rectified by an absolute-value circuit, then passed through a low-pass filter, as in the high-frequency level detection unit in the fourth embodiment.

The lower-limit comparison unit 54 receives both the noise level signal NL and the noise-detection signal D generated by the noise-detection unit 56. The lower-limit comparison unit 54 compares the noise level signal NL with a predetermined lower limit value, and generates a control signal CS that is high when the noise-detection signal D is high and the noise level NL is equal to or less than the lower limit value. At other times, the control signal CS is low. The control signal CS is supplied to the noise-width generation unit 18.

The noise-width generation unit 18 operates as described in the first embodiment when the control signal CS is low. When the control signal CS is high, the noise-width generation unit 18 does not expand the gate pulses, but supplies the noise-detection signal D to the correction unit 20 as the gate signal EG.

This control process prevents expanded portions of the audio signals from being modified in order to remove small noise impulses completely. As pointed out in the fourth embodiment, expanding the gate pulses may increase the correction error, especially when strong high-frequency components are present. When the impulse noise level is low, it is preferable to leave a certain amount of uncorrected impulse noise in order to avoid large correction errors.

Sixth Embodiment

Referring to FIG. 15, the sixth embodiment replaces the lower-limit comparison unit of the fifth embodiment with a noise-level comparison unit 58 that receives the noise level signal NL but does not receive the noise-detection signal D from the noise-detection unit 56. The noise-level comparison unit 58 compares the noise level NL with a predetermined value, and supplies the noise-width generation unit 18 with a control signal CS' that goes high when the noise level exceeds the predetermined value.

When the control signal CS' is low, the noise-width generation unit 18 operates as described in the first embodiment, expanding the pulses received from the noise-detection unit 56 according to the indicator signal I output by the electric-field-level decision unit 12. When the control signal CS' is high, the noise-width generation unit 18 increases the amount of expansion.

Strong noise impulses tend to be broadened by filtering and other processing in, for example, the stereo demodulation circuit 5 shown in FIG. 1. The sixth embodiment compensates for this effect by expanding the gate pulses by greater amounts when the impulse noise level is high than when the impulse noise level is low.

The preceding embodiments have been variously described as correcting the stereo composite signal, a monaural audio signal derived therefrom, or the left-channel and right-channel stereo audio signals, but with suitable modifications, any of the embodiments can be used to correct any of these signals. For example, the third embodiment can be used to correct the left-channel and right-channel stereo audio signals by providing a separate memory for each channel.

In the embodiments above, the gate pulses were expanded by increasing amounts as the received electric-field strength decreased, but depending on how the received signal is demodulated and amplified, how noise is detected, and how the background noise constituting the noise floor is generated, a different rule may be preferable. For example, the gate pulses may be expanded by decreasing amounts as the received electric-field strength decreases, or the gate pulses may be shortened instead of being expanded.

The invention is not restricted to the reduction of impulse noise; it can be used to reduce any type of noise.

The invention is not restricted to use in an FM stereo receiver; it can be used in any type of radio receiver.

Those skilled in the art will recognize that further variations are possible within the scope claimed below.

What is claimed is:

1. A noise reducer for reducing noise included in a demodulated signal obtained by demodulation of a received radio signal, comprising:
   an electric-field-level decision unit comparing an electric-field strength of the radio signal with at least one predetermined reference value, thereby generating an indicator signal indicating said electric-field strength;
   a noise-detection unit receiving said demodulated signal and detecting said noise;
   a noise-width generation unit coupled to the electric-field-level decision unit and the noise-detection unit, generating gate pulses responsive to said indicator signal and to detection of said noise, the gate pulses generated when the indicator signal indicates a comparatively weak electric-field strength being lengthened in a relation to the gate pulses generated when the indicator signal indicates a comparatively strong electric-filed strength; and
   a correction unit coupled to the noise-width generation unit, modifying said demodulated signal during intervals indicated by the gate pulses, thereby reducing said noise.

2. The noise reducer of claim 1, wherein the noise-width generation unit includes:
   a plurality of expansion units receiving the pulses output by the noise-detection unit, and expanding the received pulses by different amounts, thereby generating respective output signals;
   a corresponding plurality of delay circuits delaying the output signals of the expansion units by different amounts, thereby generating respective delayed signals; and
   a switch selecting one of said delayed signals as said gate pulses, responsive to said indicator signal.

3. The noise reducer of claim 1, further comprising:
   a level detection unit detecting an overall amplitude level of the modified demodulated signal output by the correction unit;
   a high-frequency level detection unit detecting a high-frequency amplitude level of said modified demodulated signal; and
   a comparator comparing said overall amplitude level with said high-frequency amplitude level, and controlling the noise-width generation unit, permitting the noise-width generation unit to change the lengths of the pulses output by the noise-detection unit when said overall amplitude level exceeds said high-frequency amplitude level, and preventing the noise-width generation unit from changing the lengths of the pulses output by the noise-detection unit when said high-frequency-amplitude level exceeds said overall amplitude level.

4. The noise reducer of claim 1, wherein the noise-detection unit also detects a noise level of said demodulated signal and generates a noise level signal indicating said noise level, further comprising:
   a lower-limit comparison unit receiving said noise level signal, comparing said noise level with a predetermined lower limit, and controlling the noise-width generation unit, permitting the noise-width generation unit to change the lengths of the pulses output by the noise-detection unit when said noise level exceeds said lower limit, and preventing the noise-width generation unit from changing the lengths of the pulses output by the noise-detection unit when said noise level is less than said lower limit.

5. The noise reducer of claim 1, wherein the noise-detection unit also detects a noise level of said demodulated signal and generates a noise level signal indicating said noise level, further comprising:
   a noise-level comparison unit receiving said noise level signal, comparing said noise level with a predetermined value, and controlling the noise-width generation unit, causing the noise-width generation unit to change the lengths of the pulses output by the noise-detection unit by increased amounts when said noise level exceeds said predetermined value.

6. The noise reducer of claim 1, wherein the demodulated signal is a digital signal comprising consecutive samples, and the correction unit includes:
   a memory storing a certain number of most recent samples of the demodulated signal; and
   a computation unit altering the samples stored in the memory, responsive to the gate pulses.

7. A method of reducing noise in a demodulated signal obtained by demodulation of a radio signal, comprising:
   (a) determining an electric-field strength of said radio signal;
   (b) comparing said electric-field strength with at least one predetermined reference value, thereby generating an indicator signal indicating said electric-field strength;
   (c) detecting the noise in said demodulated signal;
   (d) generating gate pulses responsive to said indicator signal and to detection of said noise, the gate pulses generated when the indicator signal indicates a comparatively weak electric-field strength being lengthened in relation to the gate pulses generated when the indicator signal indicates a comparatively strong electric-field strength; and
   (e) modifying said demodulated signal during intervals indicated by the gate pulses, thereby generating a modified demodulated signal from which noise has been removed.

8. The method of claim 7, wherein said step (d) further comprises:
   expanding the pulses output in said step (c) by different amounts, thereby generating a plurality of expanded signals;
   delaying the expanded signals by different amounts, thereby generating respective delayed signals; and
   selecting one of the delayed signals as said gate pulses, responsive to said indicator signal.

9. The method of claim 7, further comprising:
   (f) detecting an overall amplitude level of said modified demodulated signal;
   (g) detecting a high-frequency amplitude level said modified demodulated signal;
   (h) comparing said overall amplitude level with said high-frequency amplitude level, said steps (d) and (e) being carried out when said overall amplitude level exceeds said high-frequency amplitude level; and
   (i) generating said modified demodulated signal by modifying said demodulated signal during intervals indicated by the pulses output in said step (c), when said high-frequency amplitude level exceeds said overall amplitude level.

10. The method of claim 7, further comprising:
    (j) detecting a noise level of said demodulated signal;
    (k) comparing said noise level with a lower limit, said steps (d) and (e) being carried out when the noise level exceeds said lower limit; and
    (l) generating said modified demodulated signal by modifying said demodulated signal during intervals indicated by the pulses output in said step (c), when said noise level is less than said lower limit.

11. The method of claim 7, further comprising:
    (j) detecting a noise level of said demodulated signal;
    (m) comparing said noise level with a predetermined value; and
    (n) increasing the amounts by which the lengths of the pulses output in said step (c) are changed in said step (d), when said noise level exceeds said predetermined value.

12. The method of claim 7, wherein the demodulated signal is a digital signal comprising consecutive samples, and said step (e) comprises:
    storing a certain number of most recent samples of the demodulated signal in a memory; and
    altering the samples stored in the memory, responsive to the gate pulses.

* * * * *